United States Patent
Sriram et al.

(10) Patent No.: US 7,737,476 B2
(45) Date of Patent: Jun. 15, 2010

(54) METAL-SEMICONDUCTOR FIELD EFFECT TRANSISTORS (MESFETS) HAVING SELF-ALIGNED STRUCTURES

(75) Inventors: Saptharishi Sriram, Cary, NC (US); Jason Henning, Carrboro, NC (US); Keith Wieber, Siler City, NC (US)

(73) Assignee: Cree, Inc., Durham, NC (US)

( * ) Notice: Subject to any disclaimer, the term of this patent is extended or adjusted under 35 U.S.C. 154(b) by 179 days.

(21) Appl. No.: 11/706,762

(22) Filed: Feb. 15, 2007

(65) Prior Publication Data

US 2008/0197382 A1 Aug. 21, 2008

(51) Int. Cl.
*H01L 29/80* (2006.01)
*H01L 31/112* (2006.01)
(52) U.S. Cl. .................................. 257/280; 438/180
(58) Field of Classification Search ................. 257/288, 257/368, 369, 370, 377, 387, 280
See application file for complete search history.

(56) References Cited

U.S. PATENT DOCUMENTS

| | | | | |
|---|---|---|---|---|
| 5,767,556 A | * | 6/1998 | Yanagigawa | 257/402 |
| 6,134,424 A | * | 10/2000 | Nishihori et al. | 455/127.1 |
| 6,316,793 B1 | * | 11/2001 | Sheppard et al. | 257/103 |
| 6,541,319 B2 | * | 4/2003 | Mun et al. | 438/174 |
| 6,686,616 B1 | * | 2/2004 | Allen et al. | 257/280 |
| 7,122,859 B2 | * | 10/2006 | Shimotsusa | 257/336 |
| 2003/0075719 A1 | | 4/2003 | Sriram | |
| 2006/0180831 A1 | * | 8/2006 | Nakazawa et al. | 257/189 |
| 2007/0096189 A1 | * | 5/2007 | Iwasaki et al. | 257/306 |
| 2007/0292999 A1 | | 12/2007 | Henning et al. | |

OTHER PUBLICATIONS

Wolf et al., "Silicon Processing for the VLSI Era, vol. I: Process Technology," Lattice Press, Sunset Beach, CA, 2002, pp. 133-137 and 168.

Choi et al., "Sublithographic nanofabrication technology for nanocatalysts and DNA chips," J. Vac. Sci. Technol B 21(6), Nov./Dec. 2003, pp. 2951-2955.

Henning et al., Transistors Having Implanted Channels and Implanted P-Type Regions Beneath the Source Region and Methods of Fabricating the Same, U.S. Appl. No. 11/700,268, filed Jan. 31, 2007.

* cited by examiner

*Primary Examiner*—Phuc T Dang
(74) *Attorney, Agent, or Firm*—Myers Bigel Sibley & Sajovec

(57) ABSTRACT

Metal-semiconductor field-effect transistors (MESFETS) are provided. A MESFET is provided having a source region, a drain region and a gate. The gate is between the source region and the drain region. A p-type conductivity layer is provided beneath the source region, the p-type conductivity layer being self-aligned to the gate. Related methods of fabricating MESFETs are also provided herein.

36 Claims, 6 Drawing Sheets

METAL-SEMICONDUCTOR FIELD EFFECT TRANSISTORS (MESFETS) HAVING SELF-ALIGNED STRUCTURES

STATEMENT OF GOVERNMENT INTEREST

This invention was made with Government support under contract number 05-2-5507 awarded by the United States Air Force. The Government has certain rights in this invention.

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads.

Metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In particular, silicon carbide (SiC) MESFETs are used in commercial communication applications as well as in high power amplifiers for defense. In these applications, as well as others, the high gain, low distortion, and high efficiency provided by the SiC MESFET are desirable. However, manufacturing costs of SiC MESFETs may be higher than the costs of competing technologies, such as silicon devices.

SUMMARY OF THE INVENTION

Some embodiments of the present invention provide metal-semiconductor field-effect transistors (MESFETs). A MESFET is provided having a source region, a drain region and a gate. The gate is between the source region and the drain region. A p-type conductivity layer is provided beneath the source region. The p-type conductivity layer is self-aligned to the gate.

In further embodiments of the present invention, a silicon carbide (SiC) substrate may be provided. A semiconductor layer may be provided on the SiC substrate. The semiconductor layer may define a recess and the gate may be provided in the recess. In certain embodiments of the present invention, the gate may have a length of from about 0.2 to about 0.4 μm and may include polysilicon.

In still further embodiments of the present invention, a sidewall spacer may be provided on a sidewall of the gate. The source region may include an n+ region and the n+ region may be self-aligned to the sidewall spacer on the sidewall of the gate. The sidewall spacer may have a width of about 0.2 μm.

In some embodiments of the present invention, an n-type conductivity layer may be provided beneath the source region and may be self-aligned to the gate.

In still further embodiments of the present invention, source and drain contacts may be provided on the source and drain regions, respectively. A passivation layer may be provided on a surface of the MESFET including the source and drain contacts. The passivation layer may define an opening that at least partially exposes a surface of the gate. A gate reinforcement metal may be provided in the opening. The gate reinforcement metal may have a width of from about 0.4 to about 0.6 μm.

Some embodiments of the present invention provide silicon carbide (SiC) metal-semiconductor field-effect transistor (MESFETs). A SiC substrate is provided. A MESFET is provided on the SiC substrate. The MESFET has a source region, a drain region and a gate. The gate is between the source region and the drain region. A semiconductor layer is provided on the SiC substrate and defines a recess. The gate is provided in the recess. A p-type conductivity layer is provided beneath the source region and is self-aligned to the gate.

While the present invention is described above primarily with reference to MESFETs, methods of fabricating MESFETs are also provided.

DETAILED DESCRIPTION OF THE INVENTION

Figure 1:
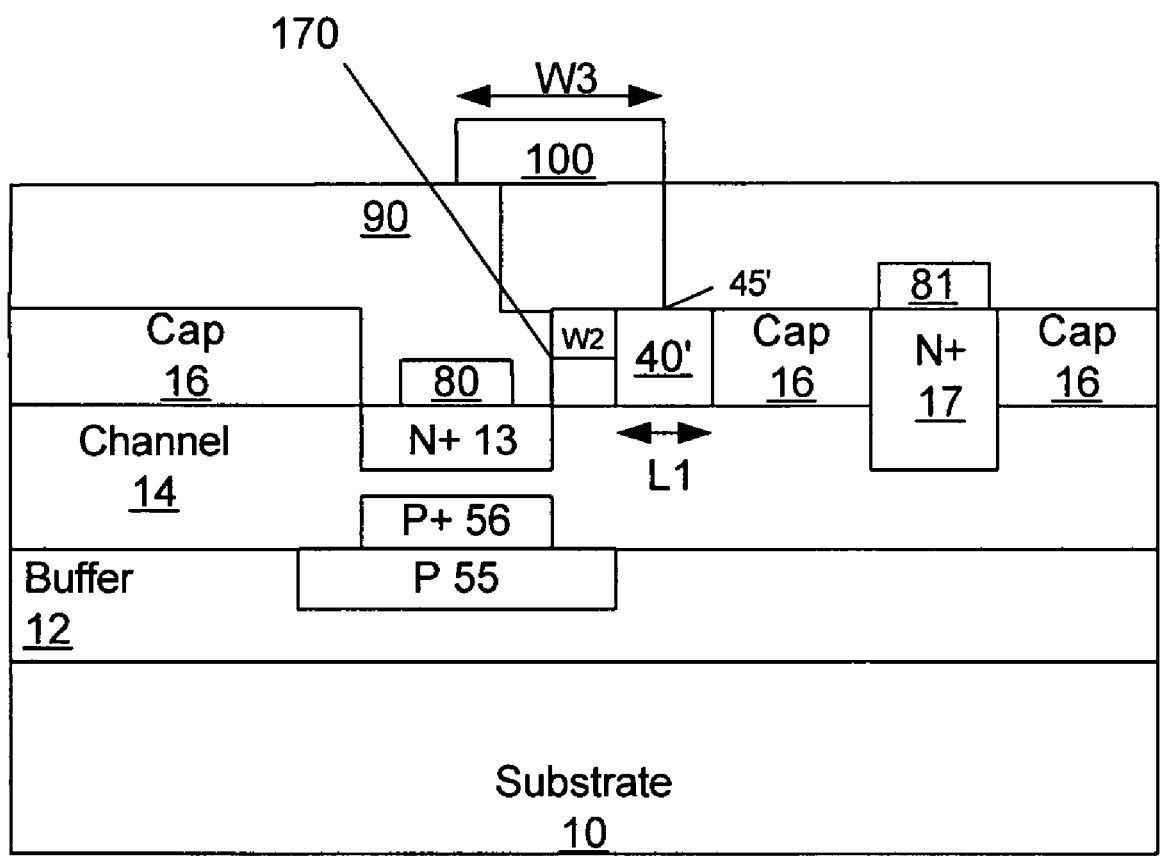
FIG. 1 is a cross-sectional view of metal-semiconductor field-effect transistors (MESFET) according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention. Optional elements of the cross-sections are illustrated by dotted lines in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies and currents.

Embodiments of the present invention will now be described in detail below with reference to FIGS. 1 through 2J that illustrate various embodiments of the present invention and various processes of fabricating embodiments of the present invention. Silicon carbide (SiC) metal semiconductor field effect transistors (MESFETs) have been found to be attractive in commercial communication applications as well as in high power amplifiers. In these applications, high gain, low distortion and high efficiency are typically very important. Furthermore, a low cost, quality manufacturing process may also be important, especially for marketability. Thus, improved MESFETs and methods of fabricating MESFETs are provided according to some embodiments of the present invention.

MESFETs, according to some embodiments of the present invention, provide manufacturing processes for MESFETS that may use similar tools and techniques used in silicon processing. Thus, according to some embodiments of the present invention, self-aligned structures are provided, such as a gate, source regions and buried p-type layers, which may simplify the fabrication process of MESFETs by removing processing steps. Furthermore, processing techniques according to some embodiments of the present invention may enable fabrication of devices having short gate lengths, such as 0.2 to 0.4 μm, without using sophisticated, expensive submicron lithography techniques. Furthermore, methods according to some embodiments of the present invention may improve yield, reproducibility and reduce cost. Device performance may also be improved due to independent optimization of the source, channel and drain regions of the devices as discussed further below with respect to FIGS. 1 through 2J.

Referring now to FIG. 1, metal-semiconductor field effect transistors (MESFETs) according to some embodiments of the present invention will be discussed. As illustrated in FIG. 1, a substrate 10 is provided. In particular, the substrate 10 in embodiments of the present invention illustrated in FIG. 1 may be a single crystal bulk silicon carbide (SiC) semi-insulating substrate. The substrate 10 may include 6H, 4H, 15R or 3C silicon carbide. In some embodiments of the present invention, the substrate 10 may have a thickness of from about 100 μm to about 400 μm. Although some embodiments of the present invention are discussed herein as having SiC substrates, embodiments of the present invention are not limited to this configuration.

A buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $0.5 \times 10^{15}$ cm$^{-3}$ to about $3.0 \times 10^{15}$ cm$^{-3}$. Suitable dopants include aluminum, boron and/or gallium. The buffer layer 12 may have a thickness of from about 0.5 to about 2.0 ηm. Although the buffer layer 12 is described above as p-type silicon carbide, embodiments of the present invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 may be less than about $5.0 \times 10^{14}$ cm$^{-3}$.

As further illustrated in FIG. 1, buried p-type conductivity regions are also provided. A p-type conductivity layer 55 that is self-aligned to the gate 40' is provided in the buffer layer 12 beneath a source region of the device. As used herein, "self-aligned" refers to elements that are aligned to each other such that there is zero tolerance. The p-type conductivity layer 55 may be doped using, for example, aluminum or boron. The p-type conductivity layer 55 may have a carrier concentration of from about $1.0 \times 10^{18}$ to about $5.0 \times 10^{19}$ cm$^{-3}$. Although, the p-type conductivity layer 55 is illustrated as being in the buffer layer 12 in FIG. 1, embodiments of the present invention are not limited to this configuration. For example, the p-type conductivity layer 55 may be provided in the substrate 10 without departing from the scope of the present invention.

As further illustrated in FIG. 1, a p+ region 56 is provided beneath the source such that it contacts at least a portion of a surface of the p-type conductivity layer 55. As used herein, "p+" or "n+" refer to regions that are defined by higher carrier concentrations than are present in adjacent or other regions of the same or another layer or substrate. The p+ region 56 is a region of p-type conductivity, for example, p-type conductivity silicon carbide. For the p+ region 56, carrier concentrations of from about $1.0 \times 10^8$ cm$^{-3}$ to about $1.0 \times 10^{20}$ cm$^{-3}$ may be suitable, but carrier concentrations as high as possible are preferred. The carrier concentration may not be constant throughout the p+ region 56, but it is preferable that the carrier concentration be as high as possible at the surface of the p+ region 56 to facilitate the formation of ohmic contacts thereon (not shown).

The buffer layer 12 may be disposed between the substrate 10 and n-type conductivity channel layer 14. The n-type conductivity channel layer 14 may be formed of n-type conductivity silicon carbide of 6H, 4H, 15R or 3C polytype and may have a thickness of from about 0.05 to about 0.1 μm. The n-type conductivity channel layer 14 may include one or more layers of, for example, n-type conductivity silicon carbide having different carrier concentrations without departing from the scope of the present invention. Exemplary alternative channel layers are discussed in detail in commonly assigned United States Patent Application Publication No. US 2003/0075719 to Sriram, filed on Oct. 24, 2001 entitled Delta Doped Silicon Carbide Metal-Semiconductor Field Effect Transistors Having a Gate Disposed in a Double Recess Structure, the disclosure of which is incorporated herein by reference as if set forth in its entirety.

Although not illustrated in FIG. 1, an optional (as indicated by the dotted lines) n-type conductivity layer 50 (FIG. 2D) that is self-aligned to the gate may be provided beneath the source region. The optional n-type conductivity layer 50 may be provided to reduce a source resistance of the device. In some embodiments of the present invention, the n-type conductivity layer 50 may be n-type conductivity-SiC, for example, 6H, 4H, 15R or 3C polytype SiC. The n-type conductivity layer 50 may be substantially depleted by the built in potential of the p-n junction. Thus, the substantially depleted n-type conductivity layer 50 may selectively increase a thickness and conductivity of a channel region beneath the source to gate region. In some embodiments of the present invention the n-type conductivity layer 50 may be completely depleted. As discussed above, the presence of the n-type conductivity layer 50 beneath the source may reduce the source resistance.

As further illustrated in FIG. 1, n+ regions 13 and 17 that respectively define a source region and a drain region of the device are provided. The source and drain regions 13 and 17 are typically of n-type conductivity silicon carbide and have carrier concentrations that are greater than the carrier concentration of the n-type conductivity channel layer 14. For the n+ regions 13 and 17, carrier concentrations of about $1 \times 10^{19}$ cm$^{-3}$ may be suitable, but carrier concentrations as high as possible are preferred.

Ohmic contacts 80 and 81 are provided on the source and drain regions 13 and 17, respectively, and are spaced apart so as to provide the source contact 80 and the drain contact 81. In some embodiments of the present invention, the ohmic contacts 80 and 81 may include nickel or other suitable metals.

As further illustrated in FIG. 1, MESFETs according to some embodiments of the present invention include a cap layer 16. The cap layer has a thickness of from about 0.1 to about 0.2 μm and a carrier concentration of less then about $1.0 \times 10^{16}$ cm$^{-3}$. A recess 170 is provided in the cap layer 16 that exposes at least a portion of a surface of the n-type channel layer 14. The source contact 80 is provided in the recess on the n+ region 13. Also provided in the recess 170 is the gate 40' which may include, for example, polysilicon. The gate may have a length L1 from about 0.2 to about 0.4 μm. In other words, the gate 40' may extend from about 0.2 to about 0.4 μm from the sidewall of the cap layer 16 into the recess. In devices according to some embodiments of the present invention, the high schottky barrier height of polysilicon on silicon carbide may provide low leakage and high breakdown. Furthermore, the polysilicon may react with silicon carbide at very high temperatures, which may allow devices according to some embodiments of the present invention to be useful at high temperatures.

Sidewall spacers 45' are provided on a sidewall of the gate 40'. The sidewall spacers 45' may include, for example, oxide and may have a width W2 of about 0.2 μm. A gate reinforcement metal 100 is provided on the gate 40' and the spacer 45' between the source and drain contacts 80 and 81. The gate reinforcement metal may have a width W3 of from about 0.4 to about 0.6 μm. The gate reinforcement metal is offset as illustrated in FIG. 1.

A passivation layer 90 is provided on the remaining surface of the device. As illustrated in FIG. 1, an opening is formed in the passivation layer 90 and the gate reinforcement metal 100 is provided in the opening.

Figure 2A:
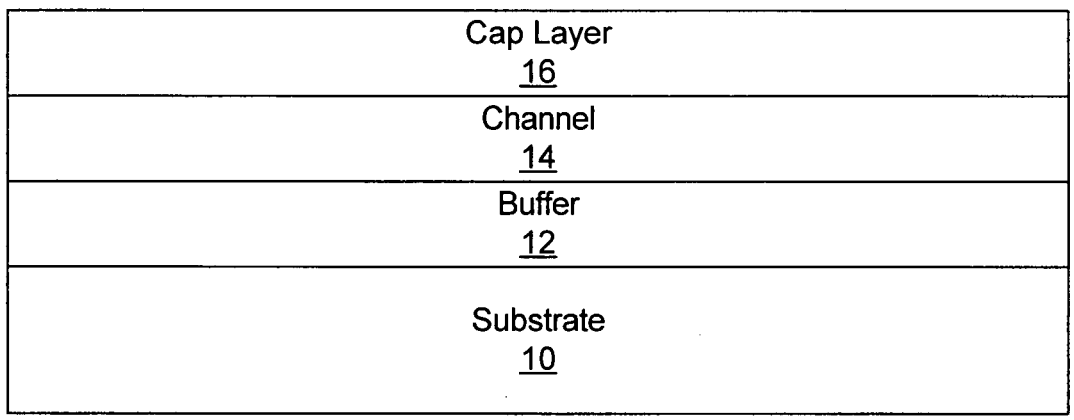
FIGS. 2A through 2J illustrate processing steps in the fabrication of MESFETs according to some embodiments of the present invention.

FIGS. 2A through 2K illustrate the fabrication of MESFETs according to some embodiments of the present invention. As seen in FIG. 2A, a buffer layer 12 may be grown or deposited on a substrate 10. As discussed above, in embodiments of the present invention illustrated in FIG. 1, the substrate 10 may be semi-insulating. The buffer layer 12 may be of p-type conductivity silicon carbide having a carrier concentration of about $3.0 \times 10^{15}$ cm$^{-3}$ or less, but typically $1.0 \times 10^{15}$ cm$^{-3}$ or less. Alternatively, the buffer layer 12 may be n-type silicon carbide or undoped silicon carbide.

As further illustrated in FIG. 2A, a channel layer 14 may be grown or deposited on the buffer layer 12. The channel layer 14 may be formed of n-type conductivity silicon carbide of 6H, 4H, 15R or 3C polytype and may have a thickness of from about 0.05 to about 0.1 μm. A cap layer 16 may be grown or deposited on the channel layer 14. The cap layer 16 may be n-type conductivity silicon carbide, have a thickness of from about 0.1 to about 0.2 μm and a carrier concentration of less than about $1.0 \times 10^{16}$ cm$^{-3}$.

Figure 2B:
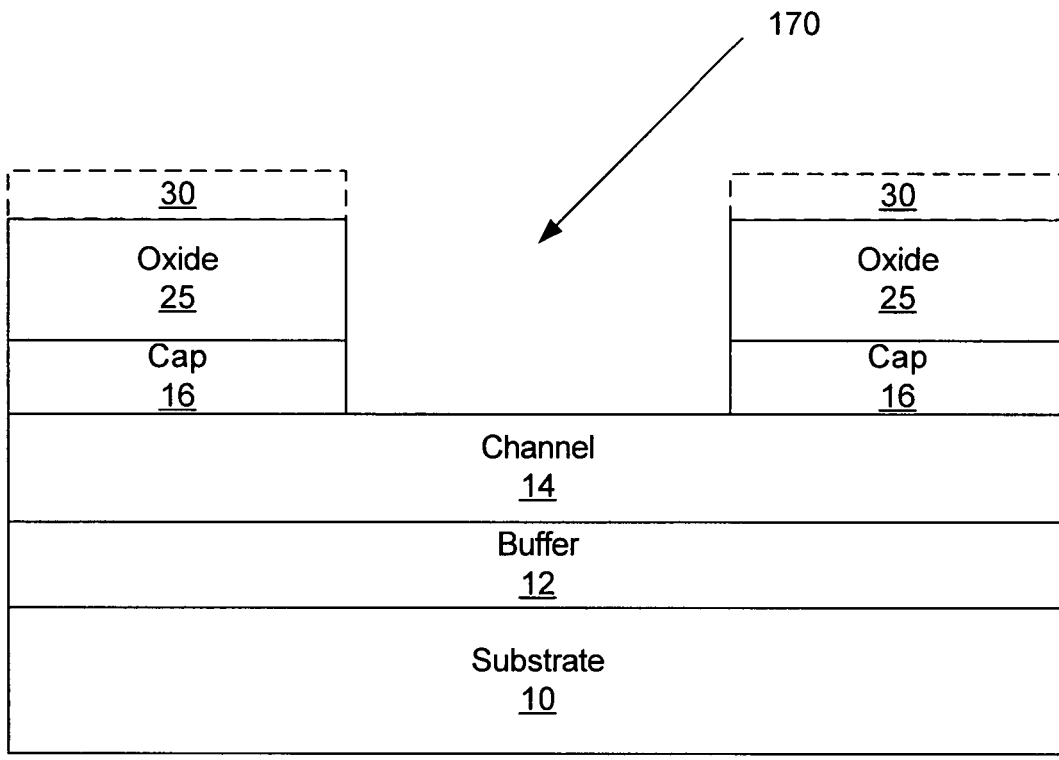

Referring now to FIG. 2B, an oxide layer 25 may be deposited on the entire surface of the structure of FIG. 2A on the cap layer 16. In some embodiments of the present invention, an optional metal layer 30 (as indicated by the dotted lines) may be formed on the oxide layer 20. A mask (not shown) may be provided on the oxide 25, or metal 30 if present, and a recess 170 may be etched into the structure according to the mask. As illustrated, the metal layer 30, the oxide layer 25 and the cap layer 16 may be etched through to form the recess 170 that exposes at least a portion of a surface of the channel layer 14. Thus, the cap layer 16, oxide layer 25 and metal 30 define the recess 170. In some embodiments of the present invention, the recess 170 may extend into the channel layer 14 without departing from the scope of the present invention.

Figure 2C:
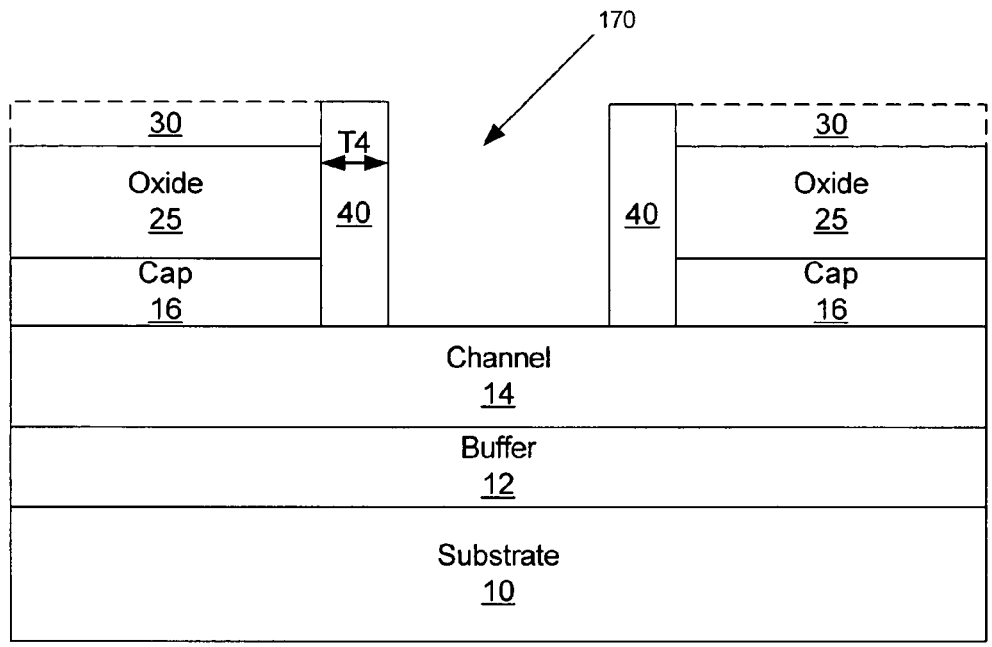

Referring now to FIG. 2C, a layer of, for example, oxide, polysilicon or nitride may be deposited on the surface of the structure of FIG. 2B. For example, the layer may be deposited using, for example, a chemical vapor deposition (CVD) process. The layer of oxide, polysilicon or nitride may be etched to form a dummy gate structure 40 as illustrated in FIG. 2C. The dummy gate structure 40 may have a length L4 of from about 0.2 to about 0.4 µm.

Figure 2D:
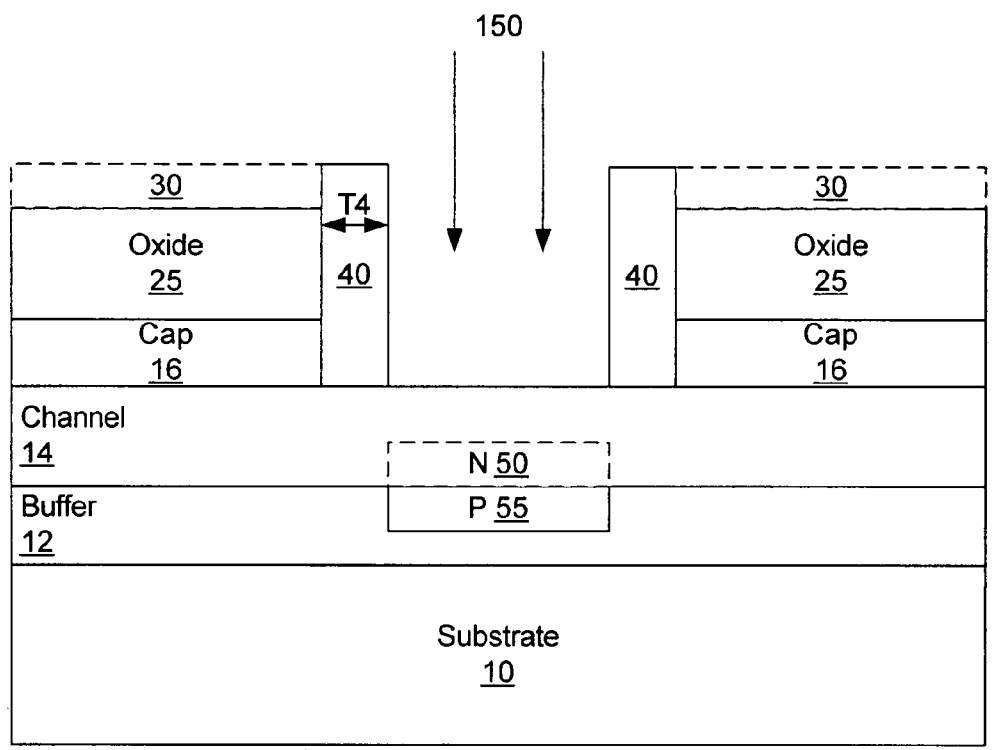

Referring now to FIG. 2D, using the dummy gate structure 40 as a mask p-type ions 150 may be implanted into the substrate to provide a p-type conductivity layer 55 in the buffer layer 12. In some embodiments of the present invention, the p-type conductivity layer may be in the substrate 10 without departing from the scope of the present invention. The p-type conductivity layer 55 may be formed by ion implantation of, for example, aluminum, boron and/or gallium. Thus, the ions are implanted in portions of the substrate 10 or buffer layer 12, to provide doped regions of p-type conductivity, for example, p-type conductivity silicon carbide. As illustrated in FIG. 2D, the p-type conductivity layer 55 is self-aligned to the dummy gate structure 40. As discussed above, "self-aligned" as used herein refers to elements that are aligned to each other such that there is zero tolerance.

In some embodiments of the present invention, nitrogen may be implanted into the device, for example, the n-type conductivity channel region 14, to provide an optional n-type conductivity layer 50 that is provided at least partially on the p-type conductivity layer 55. In some embodiments of the present invention, the n-type conductivity layer 50 may be n-type conductivity SiC, for example, 6H, 4H, 15R or 3C polytype SiC. The n-type conductivity layer 50 may be substantially depleted by the built in potential of the p-n junction. Thus, the substantially depleted n-type conductivity layer 50 may selectively increase a thickness and conductivity of a channel region beneath the source to gate region. In some embodiments of the present invention the n-type conductivity layer 50 may be completely depleted. As discussed above, the presence of the n-type conductivity layer 50 beneath the source may reduce the source resistance.

Figure 2E:
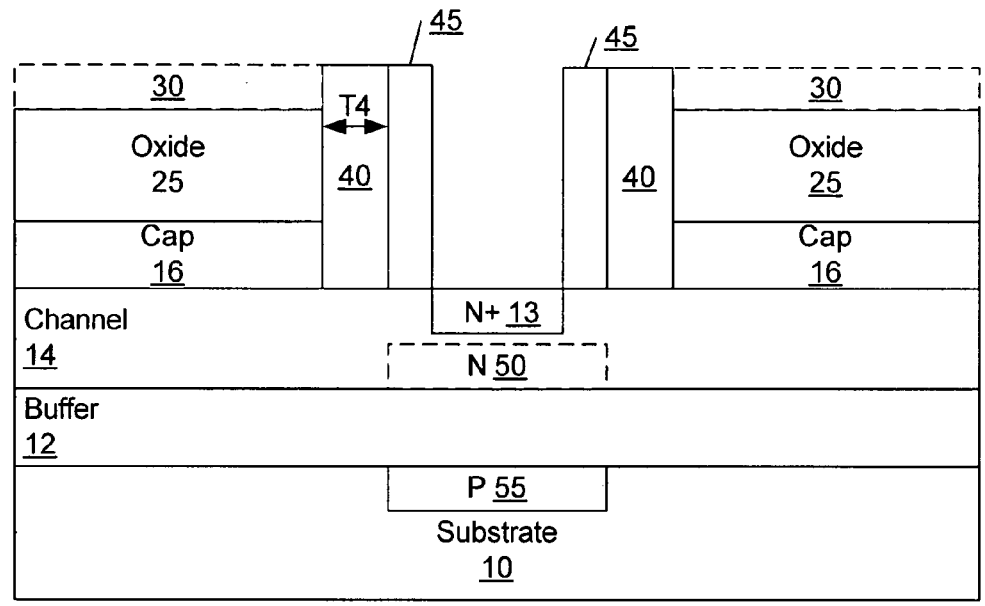

Referring now to FIG. 2E, oxide, polysilicon or nitride may be deposited on a surface of the device including the dummy gate structure 40. The oxide, polysilicon or nitride is etched to form a sidewall spacer 45 on a sidewall of the dummy gate structure 40. As further illustrated in FIG. 2E, an n+ region 13 may be implanted into the n-type channel layer 14 using the sidewall spacer 45 as a mask. The n+ region 13 is self-aligned to the sidewall spacer 45. The sidewall spacer 45 may have a width of about 0.2 µm. Thus, the n+ region 13 may be self-aligned to the dummy gate structure, but has a constant offset of 0.2 µm provided by the sidewall spacer 45.

Figure 2F:
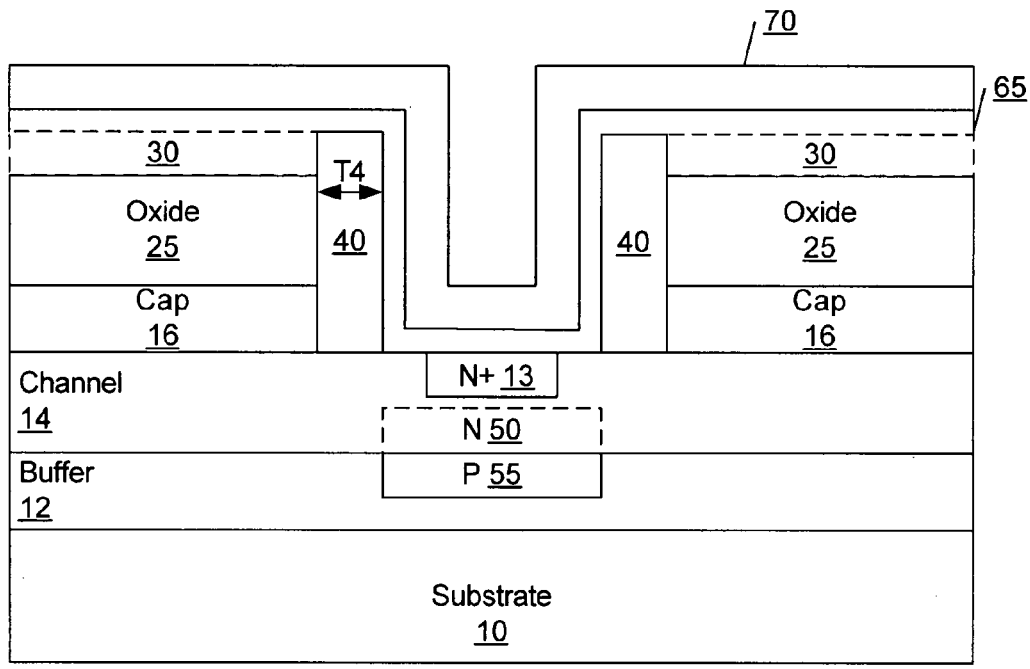

As illustrated in FIG. 2F, the sidewall spacer 45 may be removed. In some embodiments of the present invention, the sidewall spacer 45 may remain without departing from the scope of the present invention. A layer of oxide 65 is deposited on a surface of the device as illustrated in FIG. 2F. A lithography step may be formed to provide a pattern for a metal to be deposited in a subsequent processing step. A metal layer 70 may be deposited on the oxide 65. The metal layer 70 may include, for example, titanium, platinum or gold. Although the metal layer 70 is illustrated as a uniform layer in FIG. 2F, it will be understood that in some embodiments of the present invention the metal layer 70 does not cover the entire surface of the device. It is defined by the lithography step and may be open in some places.

Figure 2G:
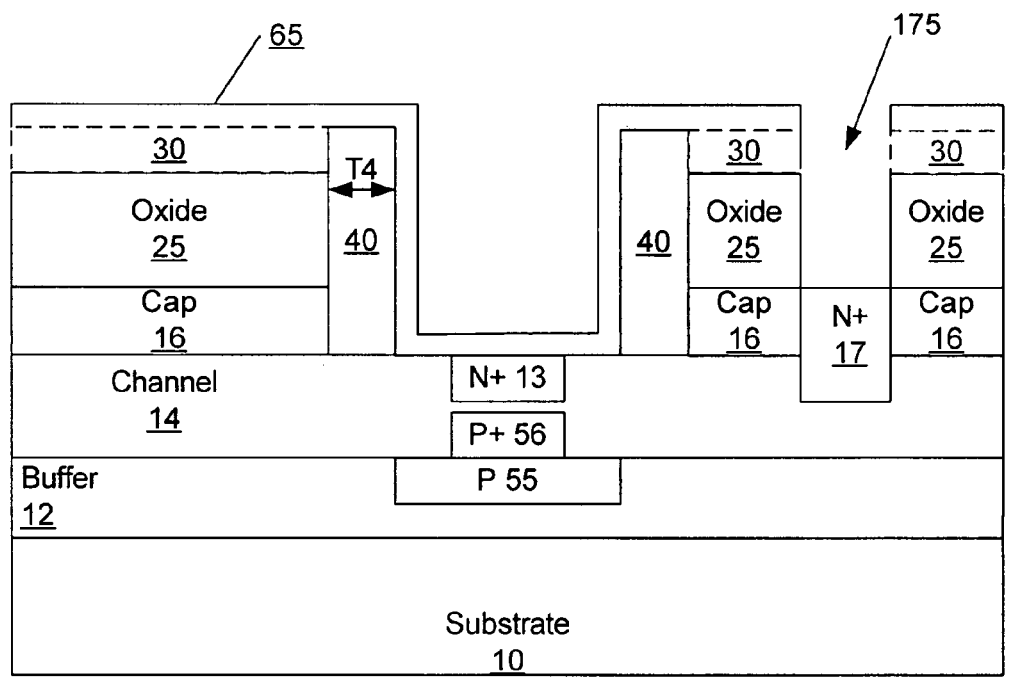

The device is etched to form a contact via (not shown) for a p+ region 56. Ions are implanted into the channel layer 14 to form a p+ region 56. As illustrated in FIG. 2G, the p+ region 56 at least partially contacts the p-type conductivity region 55. Although the p+ region 56 is illustrated in the channel layer 14 in FIG. 2G, embodiments of the present invention are not limited to this configuration. For example, the p+ region 55 may be provided in the buffer layer 12 without departing from the scope of the present invention. As further illustrated in FIG. 2G, the metals may be etched off.

A thin layer of oxide may be deposited on the device of FIG. 2G. A lift off process may be performed. An opening 175 may be etched in the oxide for formation of a drain region. Ions may be implanted to provide the n+ drain region 17 as illustrated in FIG. 2G.

Figure 2H:
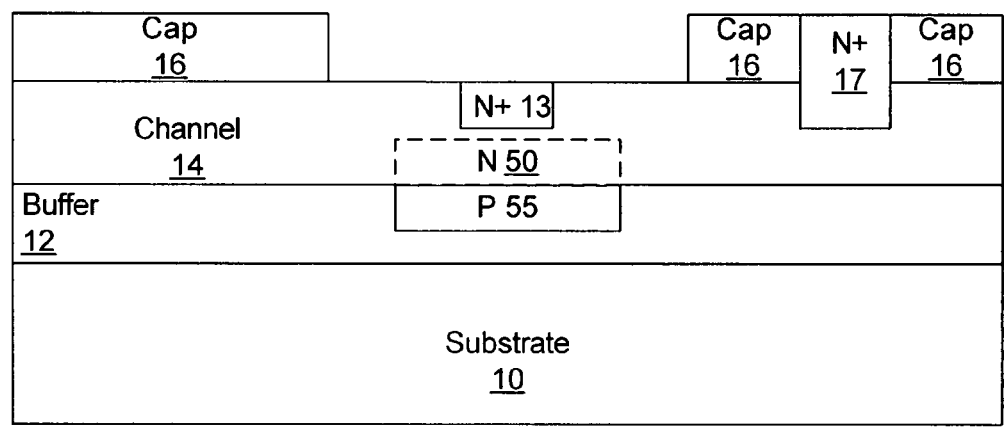

As illustrated in FIG. 2H, all oxide 25, 65, metal 30, polysilicon, nitride and the like are removed from a surface of the device. A high temperature anneal is performed to activate the implants, for example, the nitrogen and aluminum implants. Suitable anneal temperatures may be from about 1300 to about 1600° C., typically about 1500° C.

Figure 2I:
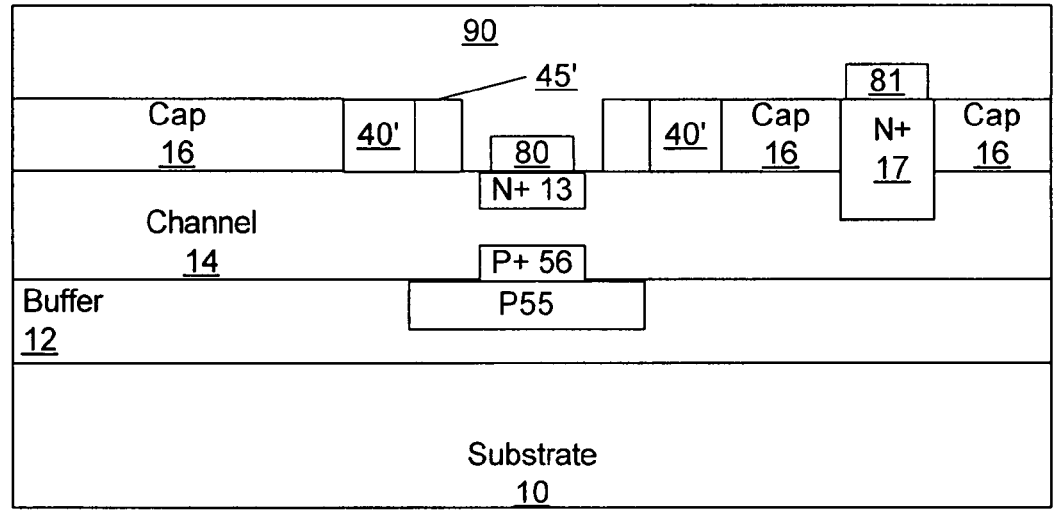

Referring now to FIG. 2I, polysilicon may be deposited and etched to form the gate 40'. The gate 40' may have a length L1 of from about 0.2 to about 0.4 µm. The gate 40' may be self-aligned to the gate recess 170. In particular, the deposited polysilicon may be planarized and etched back and may be doped with p-type impurity ions, such as Boron. Oxide may be deposited and etched to form a sidewall spacer 45' on a sidewall of the gate 40'. The sidewall spacer 45' may have a width W2 of about 0.2 µm. Furthermore, the device may etched to define an active region of the device.

As furthermore illustrated in FIG. 2I, ohmic contacts 80 and 81 may be formed on the source region 13 and drain region 17, respectively. A passivation layer 90 may be deposited on a surface of the device including the source and drain contacts 80 and 81, respectively.

Figure 2J:
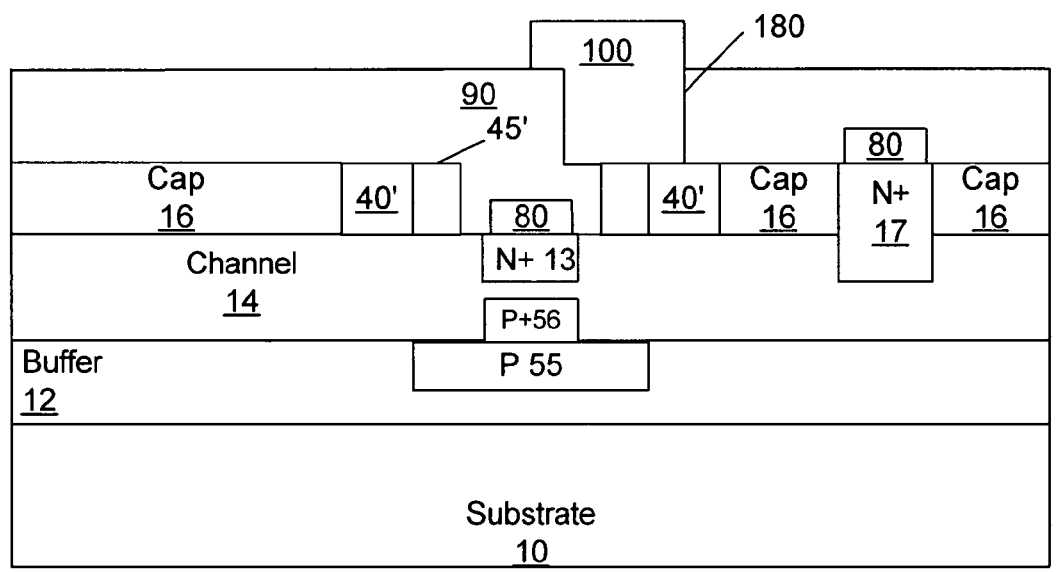

Referring now to FIG. 2J, an opening 180 may be defined in the passivation layer 90. In some embodiments of the present invention, the passivation layer 90 may be planarized. A gate reinforcement metal 100 may be provided in the opening 180 and is at least partially on the gate 40'. The gate reinforcement metal 100 is offset as illustrated in FIG. 2J. The gate reinforcement metal 100 may be formed by, for example, lift off or deposition and a subsequent etch. The gate reinforcement metal 100 may have a width W3 of from about 0.4 to about 0.6 µm. The MESFET may be completed using methods known to those having skill in the art.

Although embodiments of the present invention are discussed herein with respect to high power MESFETs, embodiments of the present invention are not limited to this configuration. For example, some embodiments of the present invention may also be suitable in fabrication of lightly doped drain structures that may be important to reduce the gate-drain feedback capacitance, $C_{gd}$, for high gain, and also for reducing the drain electric field for high reliability. Some embodiments of the present invention may also be used for split gate devices where the channel under the gate has a lower pinch off near the source side than near the drain side. This structure may increase the average electron velocity and may improve linearity and high frequency performance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising:
   a MESFET having a first contact region, a second contact region and a gate, the gate being between the first contact region and the second contact region; and
   a p-type conductivity layer beneath and spaced apart from the first contact region without extending to beneath the second contact region, the p-type conductivity layer being self-aligned to the gate.

2. The unit cell of claim 1, further comprising:
a silicon carbide (SiC) substrate; and
a semiconductor layer on the SiC substrate, the semiconductor layer defining a recess and wherein the gate is provided in the recess.

3. The unit cell of claim 2, wherein the gate has a length of from about 0.2 to about 0.4 µm.

4. The unit cell of claim 2, wherein the gate comprises polysilicon.

5. The unit cell of claim 2, further comprising a sidewall spacer on a sidewall of the gate.

6. The unit cell of claim 5, wherein the first contact region comprises an $n^+$ region and wherein the $n^+$ region is self-aligned to the sidewall spacer on the sidewall of the gate.

7. The unit cell of claim 5, wherein the sidewall spacer has a width of about 0.2 µm.

8. A unit cell of a metal-semiconductor field-effect transistor (MESFET), comprising:
a MESFET having a first contact region, a second contact region and a gate, the gate being between the first contact region and the second contact region;
a p-type conductivity layer beneath the first contact region, the p-type conductivity layer being self-aligned to the gate; and
an n-type conductivity layer beneath the first contact region that is self-aligned to the gate.

9. The unit cell of claim 1, further comprising first and second contacts on the first and second contact regions, respectively.

10. The unit cell of claim 9, further comprising a passivation layer on a surface of the MESFET including the first and second contacts, the passivation layer defining an opening that at least partially exposes a surface of the gate.

11. The unit cell of claim 10, wherein a gate reinforcement metal is provided in the opening.

12. The unit cell of claim 11, wherein the gate reinforcement metal has a width of from about 0.4 to about 0.6 µm.

13. A unit cell of a silicon carbide (SiC) metal-semiconductor field effect transistor (MESFET), comprising:
a SiC substrate;
a MESFET on the SiC substrate, the MESFET having a first contact region, a second contact region and a gate, the gate being between the first contact region and the second contact region;
a semiconductor layer on the SiC substrate that defines a recess, the gate being provided in the recess; and
a p-type conductivity layer beneath and spaced apart from the first contact region without extending to beneath the second contact region that is self-aligned to the gate.

14. The unit cell of claim 13, wherein the gate has a length of from about 0.2 to about 0.4 µm.

15. The unit cell of claim 14, wherein the gate comprises polysilicon.

16. The unit cell of claim 14, further comprising a sidewall spacer on a sidewall of the gate in the recess.

17. The unit cell of claim 16, wherein the first contact region comprises an $n^+$ region and wherein the $n^+$ region is self-aligned to the sidewall spacer on the sidewall of the gate.

18. The unit cell of claim 16, wherein the sidewall spacer has a width of about 0.2 µm.

19. A unit cell of a silicon carbide (SiC) metal-semiconductor field effect transistor (MESFET), comprising:
a SiC substrate;
a MESFET on the SiC substrate, the MESFET having a first contact region, a second contact region and a gate, the gate being between the first contact region and the second contact region;
a semiconductor layer on the SIC substrate that defines a recess, the gate being provided in the recess;
a p-type conductivity layer beneath the first contact region that is self-aligned to the gate;
an n-type channel region between the SiC substrate and the semiconductor layer; and
a $p^+$ region in the n-type channel region that at least partially contacts the p-type conductivity region.

20. A unit cell of a silicon carbide (SiC) metal-semiconductor field effect transistor (MESFET), comprising:
a SiC substrate;
a MESFET on the SiC substrate, the MESFET having a first contact region, a second contact region and a gate, the gate being between the first contact region and the second contact region;
a semiconductor layer on the SiC substrate that defines a recess, the gate being provided in the recess;
a p-type conductivity layer beneath the first contact region that is self-aligned to the gate; and
an n-type conductivity layer beneath the first contact region that is self-aligned to the gate.

21. The unit cell of claim 13, further comprising first and second contacts on the first and second contact regions, respectively.

22. The unit cell of claim 21, further comprising a passivation layer on a surface of the MESFET including the first and second contacts, the passivation layer defining an opening that at least partially exposes a surface of the gate.

23. The unit cell of claim 22, wherein a gate reinforcement metal is provided in the opening.

24. The unit cell of claim 23, wherein the gate reinforcement metal has a width of from about 0.4 to about 0.6 µm.

25. A unit cell of a transistor comprising:
a transistor having a first contact region, a second contact region and a gate, the gate being between the first contact region and the second contact region; and
a conductivity layer beneath and spaced apart from the first contact region without extending to beneath the second contact region, the conductivity layer being substantially self-aligned to the gate.

26. The unit cell of claim 25, further comprising:
a silicon carbide (SiC) substrate; and
a semiconductor layer on the SiC substrate, the semiconductor layer defining a recess and wherein the gate is provided in the recess.

27. The unit cell of claim 26, wherein the gate has a length of from about 0.2 to about 0.4 µm.

28. The unit cell of claim 26, wherein the gate comprises polysilicon.

29. The unit cell of claim 26, further comprising a sidewall spacer on a sidewall of the gate.

30. The unit cell of claim 26, wherein the first contact region comprises an $n^+$ region and wherein the $n^+$ region is self-aligned to the sidewall spacer on the sidewall of the gate.

31. The unit cell of claim 29, wherein the sidewall spacer has a width of about 0.2 µm.

32. A unit cell of a transistor comprising:
a transistor having a first contact region, a second contact region and a gate, the gate being between the first contact region and the second contact region; and
a conductivity layer beneath the first contact region, the conductivity layer being substantially self-aligned to the gate, wherein the conductivity layer comprises a p-type conductivity layer, the unit cell further comprising an n-type conductivity layer beneath the first contact region that is substantially self-aligned to the gate.

33. The unit cell of claim 25, further comprising first and second contacts on the first and second contact regions, respectively.

34. The unit cell of claim 33, further comprising a passivation layer on a surface of the transistor including the first and second contacts, the passivation layer defining an opening that at least partially exposes a surface of the gate.

35. The unit cell of claim 34, wherein a gate reinforcement metal is provided in the opening.

36. The unit cell of claim 35, wherein the gate reinforcement metal has a width of from about 0.4 to about 0.6 µm.

* * * * *

UNITED STATES PATENT AND TRADEMARK OFFICE
CERTIFICATE OF CORRECTION

PATENT NO. : 7,737,476 B2
APPLICATION NO. : 11/706762
DATED : June 15, 2010
INVENTOR(S) : Sriram et al.

It is certified that error appears in the above-identified patent and that said Letters Patent is hereby corrected as shown below:

Column 5, Line 42: Please correct "conductivity-SiC" to read -- conductivity SiC --

In the Claims
Column 10, Claim 19, Line 5: Please correct "SIC substrate" to read -- SiC substrate --

Signed and Sealed this

Fourteenth Day of December, 2010

David J. Kappos
*Director of the United States Patent and Trademark Office*